United States Patent
Huang et al.

(10) Patent No.: US 11,467,202 B2
(45) Date of Patent: Oct. 11, 2022

(54) DIAGNOSIS METHOD OF LIGHT-EMITTING DEVICE AND ELECTRONIC DEVICE

(71) Applicant: Innolux Corporation, Miao-Li County (TW)

(72) Inventors: Yu-Ming Huang, Miao-Li County (TW); Yi-Cheng Chang, Miao-Li County (TW); Chia-Huan Huang, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 43 days.

(21) Appl. No.: 17/006,914

(22) Filed: Aug. 31, 2020

(65) Prior Publication Data
US 2021/0088575 A1   Mar. 25, 2021

Related U.S. Application Data

(60) Provisional application No. 62/902,422, filed on Sep. 19, 2019.

(30) Foreign Application Priority Data

Jul. 8, 2020   (CN) .......................... 202010650885.5

(51) Int. Cl.
*G01R 31/26*    (2020.01)
(52) U.S. Cl.
CPC .............................. *G01R 31/2635* (2013.01)

(58) Field of Classification Search
CPC ................ G01R 31/26; G01R 31/2632; G01R 31/2635; G01R 31/2608; G01R 31/2621; G01R 31/2656
See application file for complete search history.

(56) References Cited

U.S. PATENT DOCUMENTS

| 6,542,082 B1 * | 4/2003 | Nowka | H05B 47/20 340/638 |
| 2010/0181941 A1 * | 7/2010 | Kuo | H05B 45/50 315/320 |
| 2016/0097822 A1 * | 4/2016 | Hopfgartner | G01R 31/44 324/414 |

* cited by examiner

*Primary Examiner* — Son T Le
(74) *Attorney, Agent, or Firm* — JCIPRNET (57) ABSTRACT

The disclosure provides an electronic device and a diagnosis method of a light-emitting device. The light-emitting device includes at least one region, and each region of the at least one region has a plurality of light-emitting units. The diagnosis method includes the following steps. A plurality of light-emitting units of one of the at least one region are illuminated by a current. A voltage value corresponding to the current is compared with a first standard voltage value corresponding to a first standard current corresponding to the one of the at least one region. Whether the one of the at least one region is abnormal is determined according to a result of comparing the voltage value with the first standard voltage value. Therefore, the diagnosis method of the disclosure may effectively diagnose whether the at least one region of the light-emitting device is abnormal.

16 Claims, 8 Drawing Sheets

DIAGNOSIS METHOD OF LIGHT-EMITTING DEVICE AND ELECTRONIC DEVICE

CROSS-REFERENCE TO RELATED APPLICATION

This application claims the priority benefits of U.S. provisional application Ser. No. 62/902,422, filed on Sep. 19, 2019, and China application serial no. 202010650885.5, filed on Jul. 8, 2020. The entirety of each of the above-mentioned patent applications is hereby incorporated by reference herein and made a part of this specification.

BACKGROUND

Field of the Disclosure

The disclosure relates to a device diagnosis method, in particular to a diagnosis method of a light-emitting device, and an electronic device thereof.

Description of Related Art

For a light-emitting device that includes a plurality of light-emitting units, a portion of the light-emitting units may become disabled after a period of time. In this regard, how to automatically and effectively diagnose the plurality of light-emitting units is currently one of the important issues in the art. In view of this, the following provides solutions in several embodiments.

SUMMARY OF THE DISCLOSURE

The disclosure provides an electronic device and a diagnosis method of a light-emitting device that may effectively diagnose whether at least one region of the light-emitting device is abnormal.

According to an embodiment of the disclosure, a light-emitting device of the disclosure includes at least one region, and each region of the at least one region has a plurality of light-emitting units. The diagnosis method of the light-emitting device of the disclosure includes the following steps. A plurality of light-emitting units of one of the at least one region are illuminated by a current. A voltage value corresponding to the current is compared with a first standard voltage value corresponding to a first standard current corresponding to the one of the at least one region. Whether the one of the at least one region is abnormal is determined according to a result of comparing the voltage value with the first standard voltage value.

According to an embodiment of the disclosure, an electronic device includes a light-emitting device, a power supply module and a microcontroller. The light-emitting device comprises at least one region, each region of the at least one region has a plurality of light-emitting units. The power supply module is coupled to the light-emitting device. The power supply module is configured to illuminate the plurality of light-emitting units of one of the at least one region by a current. The microcontroller is coupled to the light-emitting device. The microcontroller is configured to compare a voltage value corresponding to the current with a first standard voltage value corresponding to a first standard current corresponding to the one of the at least one region. The microcontroller determines whether the one of the at least one region is abnormal according to a result of comparing the voltage value with the first standard voltage value.

Based on the above, the electronic device and the diagnosis method of the light-emitting device of the disclosure may sense the current of an illuminated region of the light-emitting device, and effectively determine whether the illuminated region of the light-emitting device is abnormal via a result of comparing the voltage value corresponding to the current with the voltage value respectively corresponding to the first standard current.

In order to make the above features and advantages of the disclosure better understood, embodiments are specifically provided below with reference to figures for detailed description as follows.

BRIEF DESCRIPTION OF THE DRAWINGS

The accompanying drawings are included to further understand the disclosure, and the drawings are incorporated in the specification and constitute a part of the specification. The drawings illustrate embodiments of the disclosure and, together with the description, serve to explain principles of the disclosure.

DESCRIPTION OF THE EMBODIMENTS

Hereinafter, reference will be made in detail to exemplary embodiments of the disclosure, and examples of the exemplary embodiments are illustrated in the figures. Wherever possible, the same reference numerals are used in the figures and the descriptions to refer to the same or similar portions.

Certain terms are used throughout the specification and the appended claims of the disclosure to refer to particular elements. Those skilled in the art should understand that electronic device manufacturers may refer to the same elements under different names. The present specification is not intended to distinguish between elements having the same function but different names. In the following description and claims, the words "including" and "containing" and the like are open words, so they should be interpreted as meaning "including but not limited to . . . ."

The terminology mentioned in the specification, such as: "up", "down", "front", "rear", "left", "right", etc., are directions referring to the drawings. Therefore, the directional terms used are used for illustration, not for limiting the disclosure. In the drawings, each drawing depicts general features of methods, structures, and/or materials used in specific embodiments. However, these drawings should not be construed to define or limit the scope or nature covered by these embodiments. For example, for clarity, the relative size, thickness, and position of each film, region, and/or structure may be reduced or enlarged.

In some embodiments of the disclosure, terms such as "connection", "interconnection", etc. regarding bonding and connection, unless specifically defined, may mean that two structures are in direct contact, or that two structures are not in direct contact and there are other structures located between these two structures. Moreover, the terms bonding and connecting may also include the case where both structures are movable or both structures are fixed. In addition, the term "coupled" includes any direct and indirect electrical connection means.

The ordinal numbers used in the specification and claims, such as "first", "second", etc., are used to modify an element. They do not themselves imply and represent that the element(s) have any previous ordinal number, and also do not represent the order of one element and another element, or the order of manufacturing methods. The use of these ordinal numbers is to clearly distinguish an element with a certain name from another element with the same name. The same terms may not be used in the claims and the specification, and accordingly, a first component in the specification may be a second component in the claims. It should be noted that in the following embodiments, the technical features in several different embodiments may be replaced, recombined, and mixed to complete other embodiments without departing from the spirit of the disclosure.

In embodiment of the disclosure, the electronic device may include, for example, liquid crystals, light-emitting diodes, quantum dots (QD), fluorescence, phosphor, display equipment or display panels made of other suitable materials, or a combination of the above materials, but is not limited thereto. Light-emitting diodes may include, for example, organic light-emitting diodes (OLED), mini LEDs, micro LEDs, or quantum dot light-emitting diodes (QLED or QDLED), fluorescence, phosphor, or other suitable materials, and the materials may be arranged and combined arbitrarily, but is not limited thereto.

Figure 1:
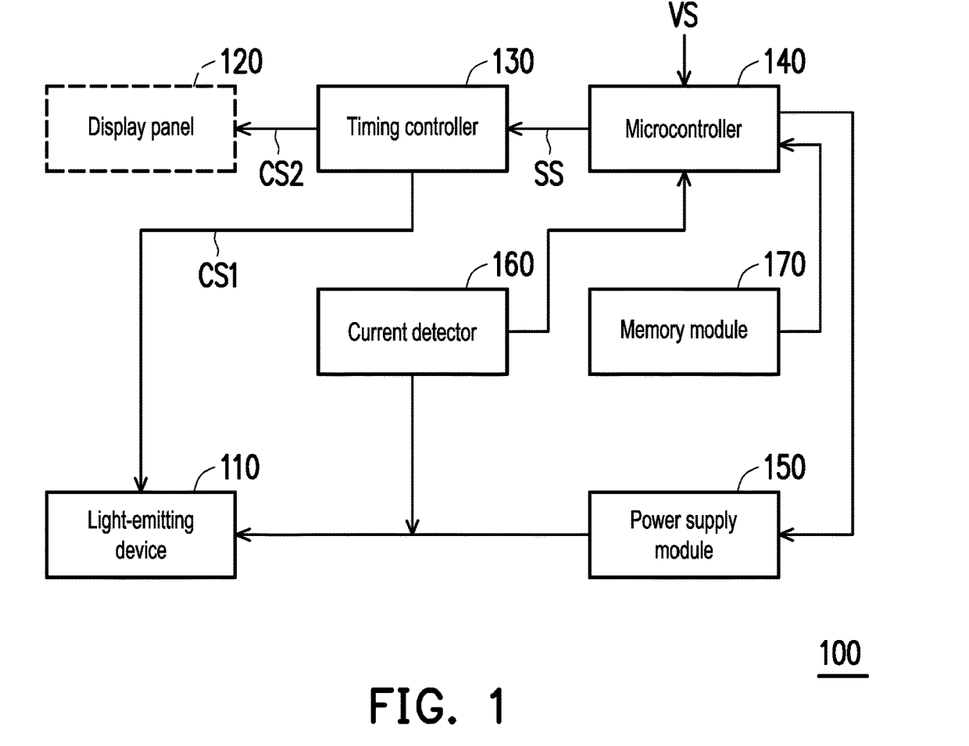
FIG. 1 is a block diagram of an electronic device of an embodiment of the disclosure.

FIG. 1 is a block diagram of an electronic device of an embodiment of the disclosure. Referring to FIG. 1, an electronic device 100 includes a light-emitting device 110, a display panel 120, a timing controller (TCON) 130, a microcontroller (microcontroller unit, MCU) 140, a power supply module 150, a current detector 160, and a memory module 170. In the present embodiment, the microcontroller 140 is coupled to the timing controller 130 and receives a vertical synchronization signal VS. The microcontroller 140 generates a selection signal SS to the timing controller 130 according to the vertical synchronization signal VS, so that the timing controller 130 decides to select and control the light-emitting device 110 or the display panel 120 according to the selection signal SS. In the present embodiment, the timing controller 130 is coupled to the light-emitting device 110 and the display panel 120, and is configured to provide control signals CS1 and CS2 to the light-emitting device 110 and the display panel 120 to control the operation and operation period of the light-emitting device 110 and the display panel 120, wherein the control signals CS1 and CS2 also include a timing signal respectively. In the present embodiment, the light-emitting device 110 may be a backlight module of a display, and the light-emitting device 110 may include a plurality of light-emitting units arranged in an array, wherein the plurality of light-emitting units may be, for example, a plurality of micro light-emitting diodes, and the light-emitting device 110 and the display panel 120 may form a display. However, the light-emitting device 110 of the disclosure may also be other types of backlight modules or other light-emitting equipment, and is not limited to the backlight module above. In other words, in some embodiments of the disclosure, the electronic device 100 may not be a display, and may not include the display panel 120.

In the present embodiment, the microcontroller 140 is coupled to the power supply module 150 to control the power supply module 150 to provide current via a power supply path to illuminate the plurality of light-emitting units of at least one region of the light-emitting device 110, and the current detector 160 is coupled to the power supply path to detect current passing through the power supply path. The current detector 160 may detect the magnitude of the current driving the at least one region of the light-emitting device 110 to provide a corresponding voltage value to the microcontroller 140. Moreover, the at least one region of the light-emitting device 110 may comprises a plurality of regions 110_1-4. In the present embodiment, the microcontroller 140 is also coupled to the current detector 160 and the memory module 170. The memory module 170 may include, for example, flash memory or others such as dynamic random-access memory (DRAM) or non-volatile random-access memory (NVRAM), etc. However, the disclosure is not limited thereto.

In the present embodiment, the microcontroller 140 may read the memory module 170 to obtain a pre-stored first standard voltage value corresponding to a first standard current, and may receive the voltage value corresponding to the magnitude of the current driving the at least one region of the light-emitting device 110 provided by the current detector 160. The microcontroller 140 may determine whether the at least one region of the light-emitting device 110 is abnormal (disabled) by comparing the voltage value corresponding to the current driving the at least one region of the light-emitting device 110 with the first standard voltage value. To make it clearer, the abnormality may be that at least one region of the light-emitting device has flickering, dark spots, or abnormal bright spots, but the disclosure is not limited thereto. The method of diagnosing whether at least one region of the light-emitting device is abnormal may be via light intensity comparison, current comparison, or voltage comparison, but the disclosure is not limited thereto. The description of the embodiments of the present application is based on voltage comparison. Moreover, when the microcontroller 140 determines that the at least one region of the light-emitting device 110 is abnormal, the microcontroller 140 may perform a further diagnosis on the plurality of light-emitting units of the at least one region.

Figure 2:
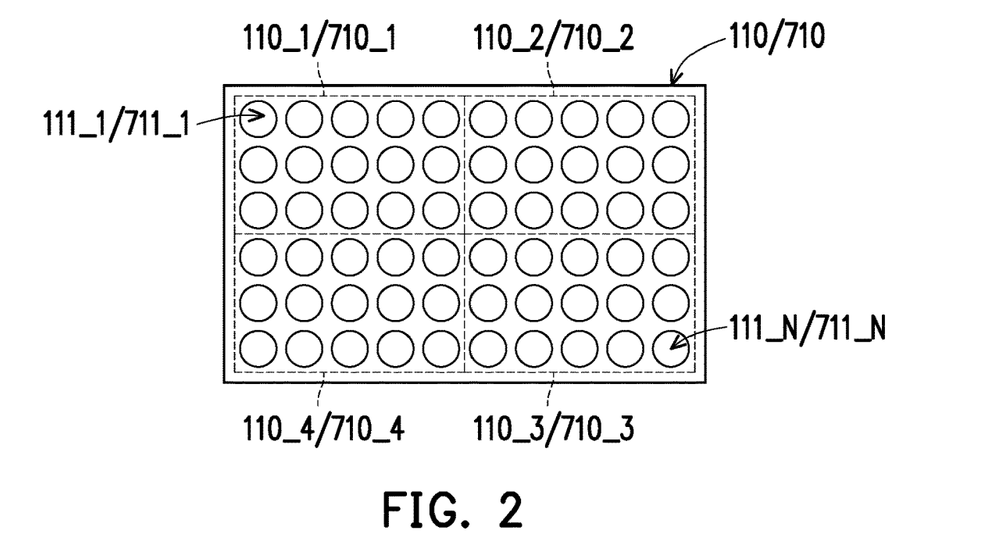
FIG. 2 is a diagram of a light-emitting device of an embodiment of the disclosure.

FIG. 2 is a diagram of a light-emitting device of an embodiment of the disclosure. Referring to FIG. 2, the light-emitting device 110 may include a plurality of light-emitting units 111_1 to 111_N arranged in an array, wherein N is a positive integer. In the present embodiment, the light-emitting units 111_1 to 111_N may be divided into four regions 110_1 to 110_4, and the light-emitting units 111_1 to 111_N may be, for example, micro light-emitting diodes, but the disclosure is not limited thereto. In some embodiments of the disclosure, the light-emitting units 111_1 to 111_N may also be divided into one or a plurality of partitions, which are not limited to those shown in FIG. 2. Referring to FIG. 1 and FIG. 2, in the present embodiment, before the electronic device 100 is manufactured and shipped, the microcontroller 140 may sense the magnitude of the first standard current of each of the illuminated regions 110_1 to 110_4, and the first standard voltage value corresponding to the first standard current corresponding to each of the regions 110_1 to 110_4 is stored in the form of digital data (described in detail in the embodiment of FIG. 3 below). Therefore, after the electronic device 100 is manufactured and shipped or used for a period of time, the microcontroller 140 may use the first standard voltage value corresponding to the first standard current of each of the regions 110_1 to 110_4 to perform an automatic diagnosis operation on the light-emitting device 110.

In the present embodiment, the current detector 160 senses the magnitude of the current of each of the illuminated regions 110_1 to 110_4 in sequence and provides the voltage value (analog value) corresponding to the current of each of the illuminated regions 110_1 to 110_4 to the microcontroller 140. The microcontroller 140 may convert the voltage value from an analog value to a digital value, and compare the first standard voltage value corresponding to the corresponding first standard current with the voltage value (digital value) corresponding to the current of each of the illuminated regions 110_1 to 110_4 in sequence to determine whether the regions 110_1 to 110_4 are normal in sequence. Then, if the microcontroller 140 determines that one of the regions 110_1 to 110_4 is abnormal, such as the illuminated region 110_3, then the microcontroller 140 may further perform independent diagnosis on each of the light-emitting units in the illuminated region 110_3 to further determine whether there is an abnormal (disabled) light-emitting unit in the illuminated region 110_3 (described in detail in the embodiment of FIG. 4 below). In other words, the microcontroller 140 of the present embodiment may first diagnose whether the light-emitting device 110 has a certain region as abnormal, and then diagnose the plurality of light-emitting units in the abnormal region.

In the present embodiment, when the microcontroller 140 determines that one of the regions 110_1 to 110_4 is abnormal, the microcontroller 140 may illuminate the plurality of light-emitting units of one of the regions 110_1 to 110_4 in sequence via the timing controller 130 and the power supply module 150. In the present embodiment, the microcontroller 140 may individually determine whether the plurality of light-emitting units of one of the regions 110_1 to 110_4 illuminated in sequence is abnormal via a second standard voltage corresponding to a preset second standard current. Therefore, compared to individually diagnosing each of the light-emitting units 111_1 to 111_N, the electronic device 100 of the present embodiment may provide an efficient diagnostic effect of the light-emitting device 110. It is worth noting that the second standard voltage corresponding to the second standard current is the default and is applicable to determining whether each of the light-emitting units 111_1 to 111_N is abnormal.

It should be noted that, in some embodiments of the disclosure, if the microcontroller 140 determines that one of the regions 110_1 to 110_4 is abnormal, for example, the illuminated region 110_3, then the microcontroller 140 may further diagnose the plurality of partitions in the illuminated region 110_3. Moreover, when a certain partition in the illuminated region 110_3 is determined to be abnormal by the microcontroller 140, the microcontroller 140 may then diagnose each light-emitting unit of a certain partition in the illuminated region 110_3 to determine whether there is an abnormal light-emitting unit in a certain partition in the illuminated region 110_3. In other words, the microcontroller 140 may perform a plurality of region diagnoses according to the number of the light-emitting units 111_1 to 111_N or different types of the light-emitting device 110, and then perform independent diagnosis for each light-emitting unit of the abnormal region or partition, and an efficient diagnostic effect of the light-emitting device 110 may also be provided.

Figure 3:
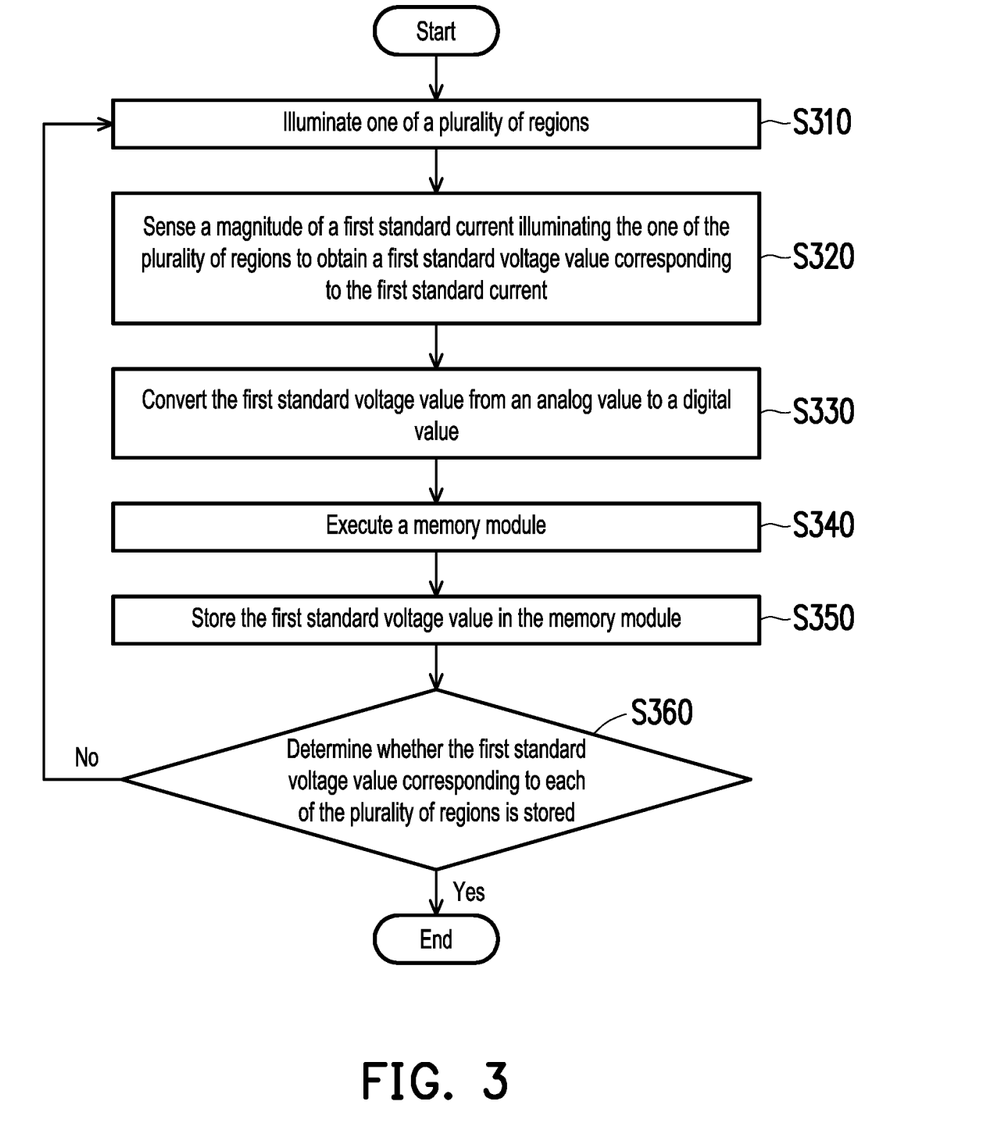
FIG. 3 is a flowchart of recording a voltage value corresponding to a first standard current of an embodiment of the disclosure.

FIG. 3 is a flowchart of recording a first standard voltage value corresponding to a first standard current of an embodiment of the disclosure. Referring to FIG. 1 to FIG. 3, in the present embodiment, before the electronic device 100 is manufactured and shipped, the microcontroller 140 may execute the following steps S310 to S360 to pre-establish a database of the first standard voltage value corresponding to the first standard current of each of the regions 110_1 to 110_4. In step S310, the microcontroller 140 illuminates one of the plurality of regions 110_1 to 110_4 of the light-emitting device 110. In step S320, the current detector 160 senses the magnitude of the first standard current illuminating one of the plurality of regions 110_1 to 110_4 to obtain a first standard voltage value (analog value) corresponding to the first standard current. In step S330, the microcontroller 140 converts the first standard voltage value from an analog value to a digital value. In step S340, the microcontroller 140 executes the memory module 170. In step S350, the microcontroller 140 stores the first standard voltage value to the memory module 170. In step S360, the microcontroller 140 determines whether the first standard voltage value corresponding to each of the regions 110_1 to 110_4 is stored. If not, the microcontroller 140 re-executes step S310 to obtain the analog voltage value corresponding to the next region, and converts it to a digital voltage value to be stored in the memory module 170. If yes, the microcontroller 140 ends the process of recording the first standard voltage value corresponding to the first standard current.

In other words, since each of the light-emitting units 111_1 to 111_N of different backlight modules 110 may have different initial current characteristics, each of the light-emitting units 111_1 to 111_N of different backlight modules may need to be normally illuminated by different initial driving currents. Therefore, the microcontroller 140 of the electronic device 100 of the present embodiment can, for example, pre-establish a look-up table (LUT) for the standard voltage value corresponding to the respective standard current of each of the regions 110_1 to 110_4 suitable for its own current characteristics before being manufactured and shipped. The LUT is stored in the memory module 170 so that when the microcontroller 140 diagnoses the light-emitting device 110, the microcontroller 140 may read and use it.

Figure 4:
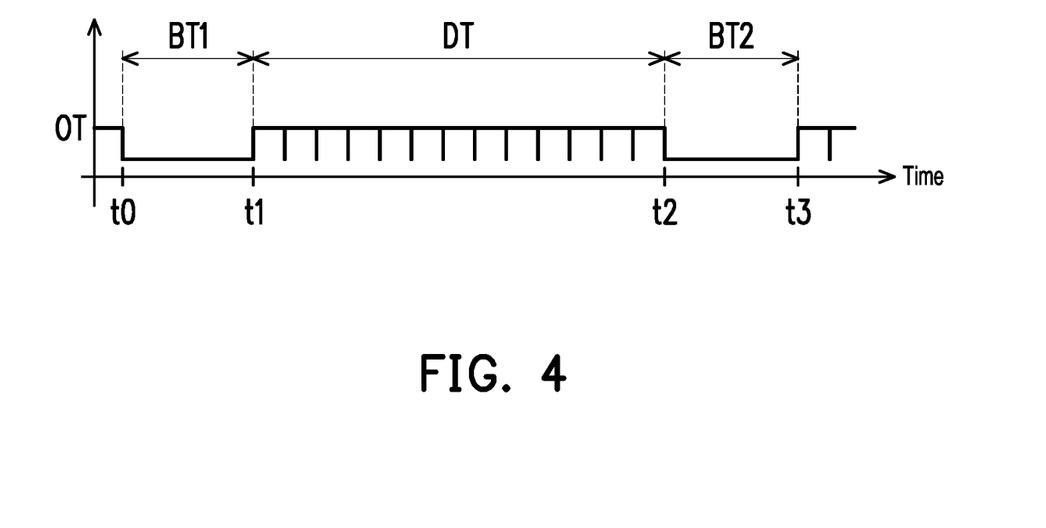
FIG. 4 is an operation timing diagram of the display panel of an embodiment of the disclosure.

FIG. 4 is an operation timing diagram of the display panel of an embodiment of the disclosure. It should be noted that since the following embodiments are exemplified by using the light-emitting device 110 as a backlight module, referring to FIG. 1, FIG. 2, and FIG. 4, the light-emitting device 110 and the display panel 120 may be integrated to operate as shown in an operation timing OT of FIG. 4. In the operation timing OT, when the microcontroller 140 receives the vertical synchronization signal VS at a time t0, the microcontroller 140 may control the display panel 120 to enter a blanking period BT1 (the time t0 to a time t1) first via the timing controller 150, and the microcontroller 140 may illuminate and sense the current of one of the regions 110_1 to 110_4 of the light-emitting device 110 or one of the light-emitting units of an abnormal region via the timing controller 150 and the current detector 160. Then, the microcontroller 140 may control the display panel 120 to enter a displaying period DT (the time t1 to a time t2) at the time t1 via the timing controller 150 to display an image screen, and the microcontroller 140 may read the memory module 170 and set the determination conditions of the plurality of light-emitting units corresponding to one of the regions 110_1 to 110_4 or the abnormal region. Moreover, when the microcontroller 140 receives the next vertical synchronization signal at the time t2 and makes the display panel 120 perform a next blanking period BT2 (the time t2 to a time t3) via the timing controller 150, the microcontroller 140 may compare a voltage value corresponding to the current sensed during the blanking period BT1 with the corresponding determination information to determine whether one of the regions 110_1 to 110_4 is abnormal or whether one of the plurality of light-emitting units of the abnormal region is abnormal.

However, in an embodiment of the disclosure, the microcontroller 140 may also diagnose the light-emitting device 110 when the display panel 120 is in sleep mode or off mode. In this regard, when the display panel 120 is operated in sleep mode or off mode, the light-emitting device 110 may also be independently operated by the microcontroller 140. In other words, the diagnosis process and sequence of each embodiment of the disclosure may not be limited to be performed according to the operation timing OT of FIG. 4.

Figure 5:
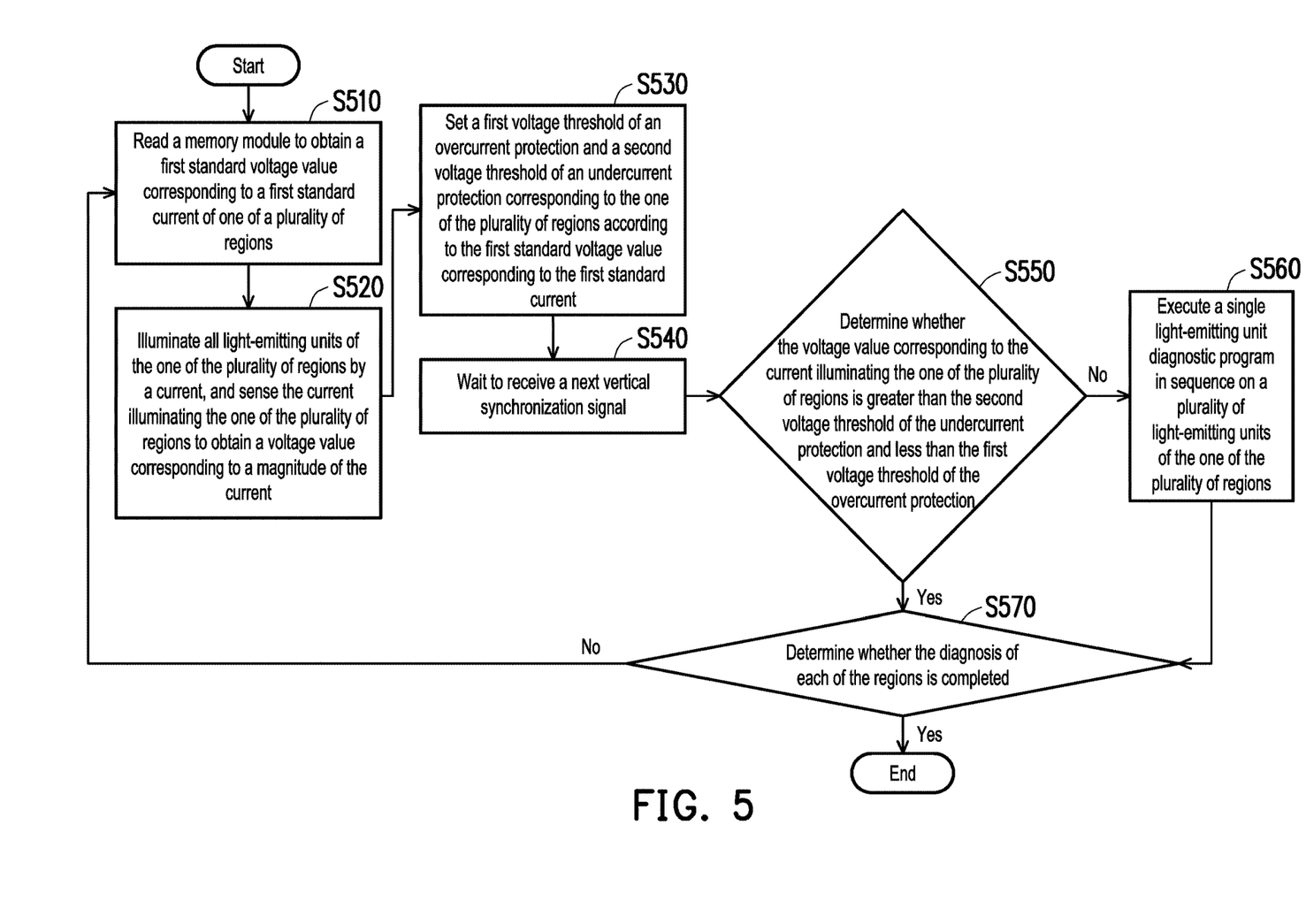
FIG. 5 is a flowchart of a diagnosis method of the light-emitting device of the embodiment of FIG. 1 of the disclosure.

FIG. 5 is a flowchart of a diagnosis method of the light-emitting device of the embodiment of FIG. 1 of the disclosure. Referring to FIG. 1, FIG. 2, and FIG. 5, in the present embodiment, the electronic device 100 may execute steps S510 to S570 to perform a region diagnostic program of the light-emitting device 110. In step S510, the microcontroller 140 may read the memory module 170 during the current blanking period (for example, the blanking period BT1 of FIG. 4) to obtain a first standard voltage value (digital value) corresponding to a first standard current of one of the plurality of regions 110_1 to 110_4. In step S520, the microcontroller 140 may also illuminate the plurality of light-emitting units of the one of the plurality of regions 110_1 to 110_4 by a current during the current blanking period, and the current detector 150 may sense the current illuminating the one of the plurality of regions 110_1 to 110_4 to provide a voltage value (analog value) corresponding to the magnitude of the current to the microcontroller 140. The microcontroller 140 may convert the voltage value corresponding to the magnitude of the current from an analog value to a digital value. In step S530, the microcontroller 140 may set a first voltage threshold TH1_OCP of an overcurrent protection (OCP) corresponding to the one of the plurality of regions and a second voltage threshold TH1_UCP of an undercurrent protection (UCP) according to the first standard voltage value (digital value) corresponding to the first standard current in the displaying period (for example, the displaying period DT of FIG. 4). In the present embodiment, the microcontroller 140 may set the first threshold TH1_OCP of the overcurrent protection and the second voltage threshold TH1_UCP of the undercurrent protection as shown in the following formulas (1) and (2), wherein V1 is the first standard voltage value corresponding to the first standard current, and ΔV1 and ΔV2 are preset variations.

$$TH1\_OCP = V1 + \Delta V1 \qquad \text{formula (1)}$$

$$TH1\_UCP = V1 - \Delta V2 \qquad \text{formula (2)}$$

In step S540, the microcontroller 140 waits to receive the next vertical synchronization signal. When the microcontroller 140 receives the next vertical synchronization signal, the microcontroller 140 executes step S550. In step S550, the microcontroller 140 may execute the determination as shown in the following formula (3) during the next blanking period (for example, the blanking period BT2 of FIG. 4) to determine whether a voltage value (V_IR) corresponding to the current illuminating the one of the plurality of regions 110_1 to 110_4 is greater than the second voltage threshold TH1_UCP of the undercurrent protection and less than the first voltage threshold TH1_OCP of the overcurrent protection. If yes, the microcontroller 140 executes step S570. If not, the microcontroller 140 first executes step S560, and then executes step S570. In step S560, the microcontroller 140 executes a single light-emitting unit diagnostic program on a plurality of light-emitting units of the one of the plurality of regions 110_1 to 110_4 in sequence. In step S570, the microcontroller 140 determines whether the diagnosis of each of the regions 110_1 to 110_4 is completed. If not, the microcontroller 140 re-executes step S520 to illuminate a plurality of light-emitting units of another of the plurality of regions 110_1 to 110_4 via another current. If yes, the microcontroller 140 ends the region diagnostic program. Therefore, the diagnosis method of the present embodiment may effectively diagnose whether the plurality of regions 110_1 to 110_4 of the light-emitting device 110 are abnormal.

$$TH1\_UCP < V\_IR < TH1\_OCP \qquad \text{formula (3)}$$

Figure 6:
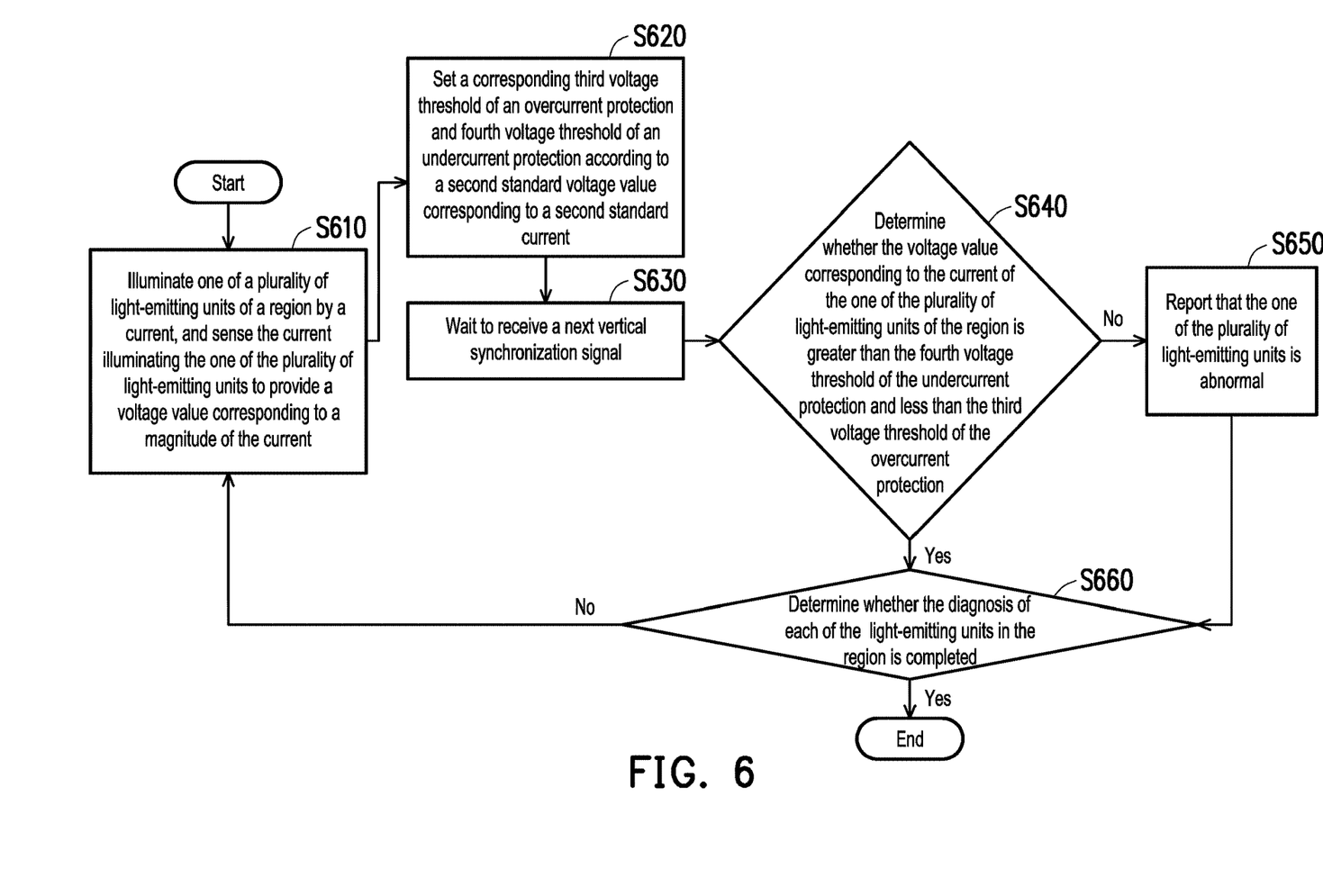
FIG. 6 is a flowchart of a single light-emitting unit diagnostic program of the embodiment of FIG. 1 of the disclosure.

FIG. 6 is a flowchart of a single light-emitting unit diagnostic program of the embodiment of FIG. 1 of the disclosure. Referring to FIG. 1, FIG. 2, and FIG. 6, in the present embodiment, the electronic device 100 may execute steps S610 to S660 to perform a region diagnostic program, and steps S610 to S660 of the present embodiment may be the embodiment of step S560 of FIG. 5. It is exemplified below that the microcontroller 140 determines that the region 110_3 is abnormal. In step S610, the microcontroller 140 may illuminate one of the plurality of light-emitting units in the region 110_3 by a current during the current blanking period (for example, the blanking period BT1 of FIG. 4), and the current detector 150 may sense the current illuminating the one of the plurality of light-emitting units to provide a voltage value (analog value) corresponding to the magnitude of the current to the microcontroller 140. The microcontroller 140 may convert the voltage value corresponding to the magnitude of the current from an analog value to a digital value. In step S620, the microcontroller 140 may set a corresponding third voltage threshold TH2_OCP of the overcurrent protection and fourth voltage threshold TH2_UCP of the undercurrent protection according to a second standard voltage value (digital value) corresponding to a second standard current in the displaying period (for example, the displaying period DT of FIG. 4). In the present embodiment, the microcontroller 140 may set the third voltage threshold TH2_OCP of the overcurrent protection and the fourth voltage threshold TH2_UCP of the undercurrent protection as shown in the following formulas (4) and (5), wherein V2 is the second standard voltage value corresponding to the second standard current, and ΔV3 and ΔV4 are preset variations. It should be noted that, the second standard current refers to the specified standard current of the light-emitting units, and each light-emitting unit is applicable to the same second standard current. Therefore, the second standard voltage value is a fixed value, and each light-emitting unit is applicable to the following third voltage threshold TH2_OCP of the overcurrent protection and fourth voltage threshold TH2_UCP of the undercurrent protection.

$$TH2\_OCP = V2 + \Delta V3 \qquad \text{formula (4)}$$

$$TH2\_UCP = V2 - \Delta V4 \qquad \text{formula (5)}$$

In step S630, the microcontroller 140 waits to receive the next vertical synchronization signal. When the microcontroller 140 receives the next vertical synchronization signal, the microcontroller 140 executes step S640. In step S640, the microcontroller 140 may execute the determination as shown in the following formula (6) during the next blanking period (for example, the blanking period BT2 of FIG. 4) to determine whether a voltage value (V_IS) corresponding to the current of the one of the plurality of light-emitting units of the region 110_3 is greater than the fourth voltage threshold TH2_UCP of the undercurrent protection and less than the third voltage threshold TH2_OCP of the overcurrent protection. If not, the microcontroller 140 executes step S660. If yes, the microcontroller 140 first executes step S650, and then executes step S660. In step S650, the microcontroller 140 reports that the one of the plurality of light-emitting units of the region 110_3 is abnormal. In step S660, the microcontroller 140 determines whether the diagnosis of each light-emitting unit of the region 110_3 is completed. If not, the microcontroller 140 re-executes step S610 to illuminate another one of the plurality of light-emitting units of the region 110_3 via another current. If yes, the microcontroller 140 ends the single light-emitting unit diagnostic program. Therefore, the single light-emitting unit diagnostic program of the present embodiment may efficiently and quickly diagnose the abnormal light-emitting unit in the plurality of light-emitting units 111_1 to 110_N of the light-emitting device 110.

$$\text{TH2\_UCP} < V\text{\_IS} < \text{TH2\_OCP} \quad \text{formula (6)}$$

Figure 7:
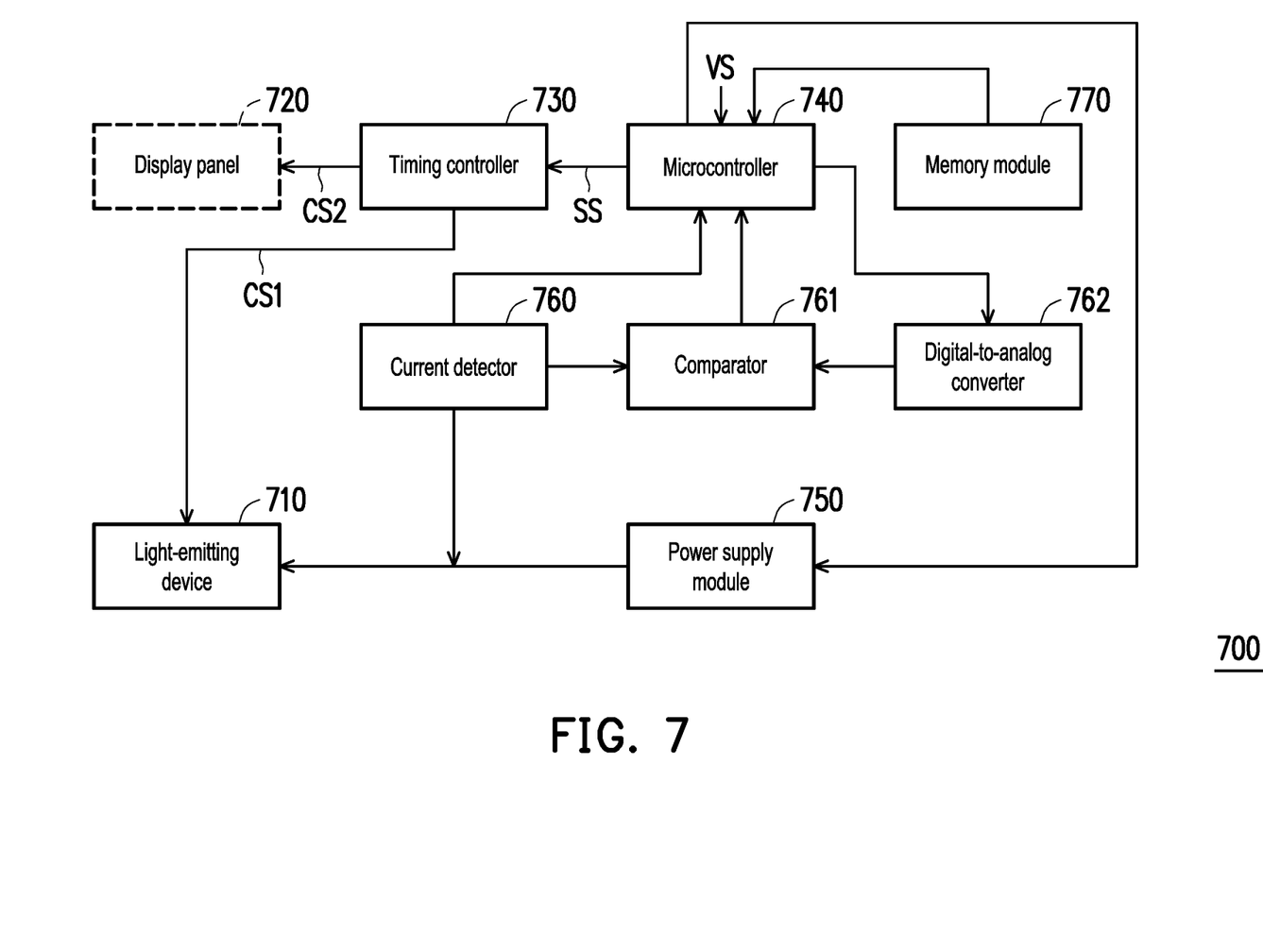
FIG. 7 is a block diagram of an electronic device of another embodiment of the disclosure.

FIG. 7 is a block diagram of an electronic device of another embodiment of the disclosure. Referring to FIG. 7, an electronic device 700 includes a light-emitting device 710, a display panel 720, a timing controller 130, a microcontroller 740, a power supply module 750, a current detector 760, a comparator 761, a digital-to-analog converter (DAC) 762, and a memory module 770. In the present embodiment, the microcontroller 740 is coupled to the timing controller 730 and receives the vertical synchronization signal VS. The microcontroller 740 generates a selection signal SS to the timing controller 730 according to the vertical synchronization signal VS, so that the timing controller 730 decides to select and control the light-emitting device 710 or the display panel 720 according to the selection signal SS. In the present embodiment, the timing controller 730 is coupled to the light-emitting device 710 and the display panel 720, and is configured to provide the control signals CS1 and CS2 to the light-emitting device 710 and the display panel 720 to control the operation and operation period of the light-emitting device 710 and the display panel 720, wherein the control signals CS1 and CS2 also include a timing signal respectively.

In the present embodiment, the microcontroller 740 is coupled to the power supply module 750 to control the power supply module 750 to provide current via a power supply path to illuminate the plurality of light-emitting units of at least one region of the light-emitting device 710, and the current detector 760 is coupled to the power supply path to detect current passing through the power supply path. The current detector 760 may detect the magnitude of the current driving the at least one region of the light-emitting device 710 to provide a corresponding voltage value to the comparator 761. In the present embodiment, the microcontroller 740 is also coupled to the current detector 760, the comparator 761, the digital-to-analog converter 762, and the memory module 770. The microcontroller 740 may read the memory module 770 to obtain a pre-stored first standard voltage value corresponding to a first standard current, and provide the first standard voltage value to the DAC 762 via a serial peripheral interface (SPI). The DAC 762 converts the first standard voltage value from a digital value to an analog value, and provides the analog first standard voltage value to the comparator 761. Therefore, the comparator 761 may compare the voltage value corresponding to the magnitude of the current driving the at least one region of the light-emitting device 710 with the first standard voltage value to output the comparison result to the microcontroller 740. In the present embodiment, the microcontroller 740 may determine whether the at least one region of the light-emitting device 710 is abnormal according to the comparison result. Moreover, when the microcontroller 740 determines that the at least one region of the light-emitting device 710 is abnormal, the microcontroller 740 may perform a further diagnosis on the plurality of light-emitting units of the at least one region.

Different from the electronic device 100 of FIG. 1, the electronic device 700 of the present embodiment compares the voltage value corresponding to the magnitude of the current driving the at least one region of the light-emitting device 710 with the first standard voltage value in an analog manner. Moreover, the light-emitting device 710 of the present embodiment may also be applied to FIG. 2. Referring to FIG. 2, the light-emitting device 710 may include a plurality of light-emitting units 711_1 to 711_N arranged in an array, and the light-emitting units 711_1 to 711_N may be divided into four regions 710_1 to 710_4, wherein N is a positive integer. In this regard, other circuit operations and implementations of the electronic device 700 of the present embodiment may be the same as those in the above embodiments of FIG. 1 and FIG. 2, and are therefore not repeated herein. In addition, the electronic device 700 of the present embodiment is also applicable to the process of recording the first standard voltage value corresponding to the first standard current of FIG. 3, and is also applicable to the operation timing of FIG. 4, which are also therefore not repeated herein.

Figure 8:
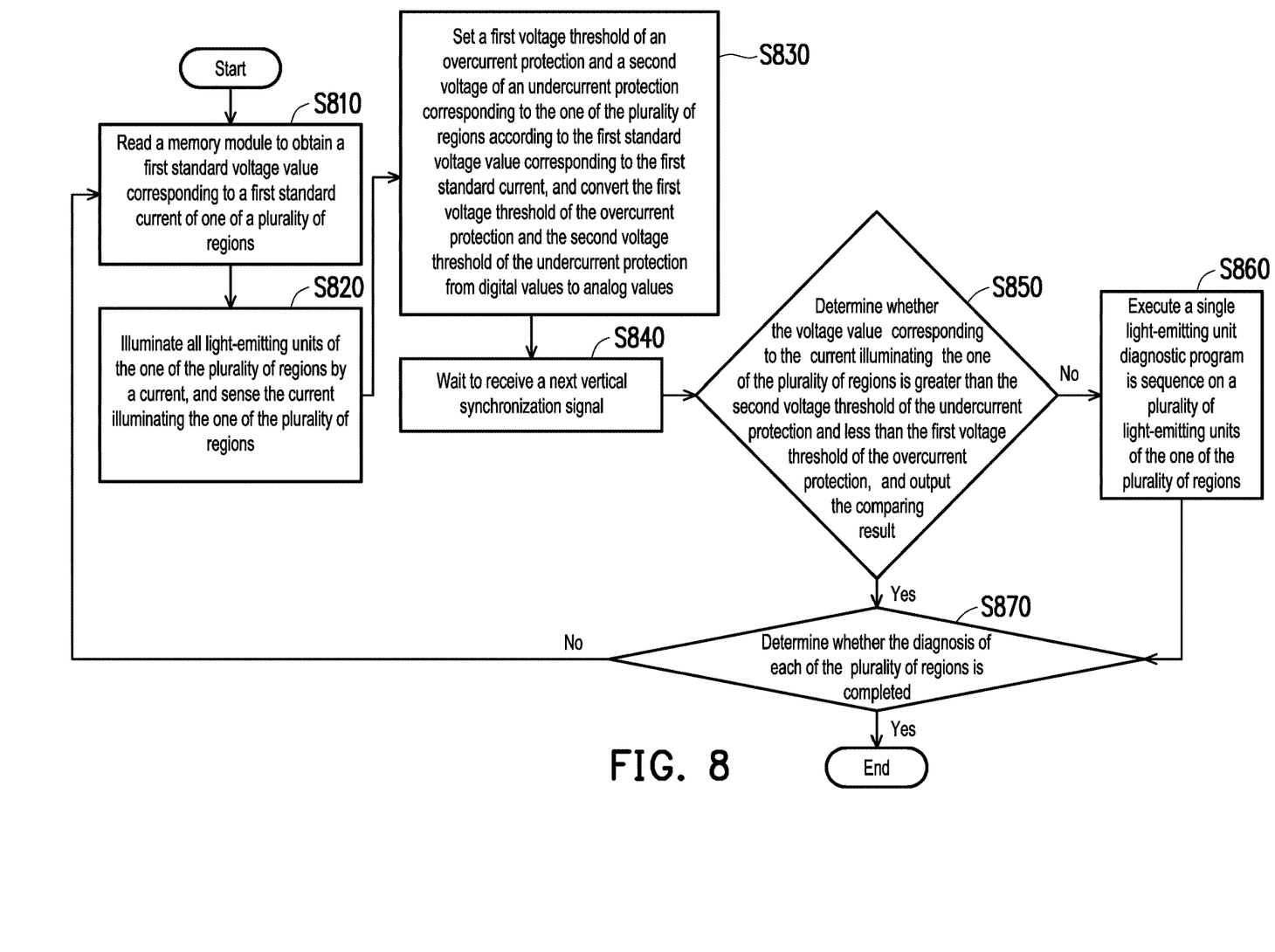
FIG. 8 is a flowchart of a diagnosis method of the light-emitting device of the embodiment of FIG. 7 of the disclosure.

FIG. 8 is a flowchart of a diagnosis method of the light-emitting device of the embodiment of FIG. 7 of the disclosure. Referring to FIG. 2, FIG. 7, and FIG. 8, in the present embodiment, the electronic device 700 may execute steps S810 to S870 to perform a region diagnostic program of the light-emitting device 710. In step S810, the microcontroller 740 may read the memory module 770 during the current blanking period (for example, the blanking period BT1 of FIG. 4) to obtain a first standard voltage value (digital value) corresponding to a first standard current of one of the plurality of regions 710_1 to 710_4. In step S820, the microcontroller 140 may also illuminate a plurality of light-emitting units of the one of the plurality of regions 710_1 to 710_4 by a current during the current blanking period, and the current detector 760 may sense the current illuminating the one of the plurality of regions 710_1 to 710_4 to provide a voltage value (analog value) corresponding to the magnitude of the current to the comparator 761. In step S830, the microcontroller 740 may set the first voltage threshold TH1_OCP of the overcurrent protection corresponding to the one of the plurality of regions shown in the above formula (1) and the second voltage threshold TH1_UCP of the undercurrent protection shown in the above formula (2) according to the first standard voltage value (digital value) corresponding to the first standard current in the displaying period (for example, the displaying period DT of FIG. 4), and provide the first voltage threshold TH1_OCP of the overcurrent protection and the second voltage threshold TH1_UCP of the undercurrent protection to the DAC 762 to convert the first voltage threshold TH1_OCP of the overcurrent protection and the second voltage threshold TH1_UCP of the undercurrent protection from digital values to analog values.

In step S840, the microcontroller 740 waits to receive the next vertical synchronization signal. When the microcontroller 740 receives the next vertical synchronization signal, the microcontroller 740 executes step S850. In step S850, the comparator 761 may implement the determination of the above formula (3) in the next blanking period (for example, the blanking period BT2 of FIG. 4), wherein the comparator 761 determines whether the voltage value (V_IR) corresponding to the current illuminating the one of the plurality of regions 710_1 to 710_4 provided by the current detector 760 is greater than the first voltage threshold TH1_UCP of the undercurrent protection provided by the DAC 762 and less than the second voltage threshold TH1_OCP of the overcurrent protection, and outputs the comparison result to the microcontroller 740. If yes, the microcontroller 140 executes step S870. If not, the microcontroller 740 first executes step S860, and then executes step S870. In step S860, the microcontroller 740 executes a single light-emitting unit diagnostic program on a plurality of light-emitting units of the one of the plurality of regions 710_1 to 710_4 in sequence. In step S870, the microcontroller 740 determines whether the diagnosis of each of the regions 710_1 to 710_4 is completed. If not, the microcontroller 740 re-executes step S820 to illuminate a plurality of light-emitting units of another of the plurality of regions 710_1 to 710_4 via another current. If yes, the microcontroller 740 ends the region diagnostic program. Therefore, the diagnosis method of the present embodiment may effectively diagnose whether the plurality of regions 710_1 to 710_4 of the light-emitting device 710 are abnormal.

Figure 9:
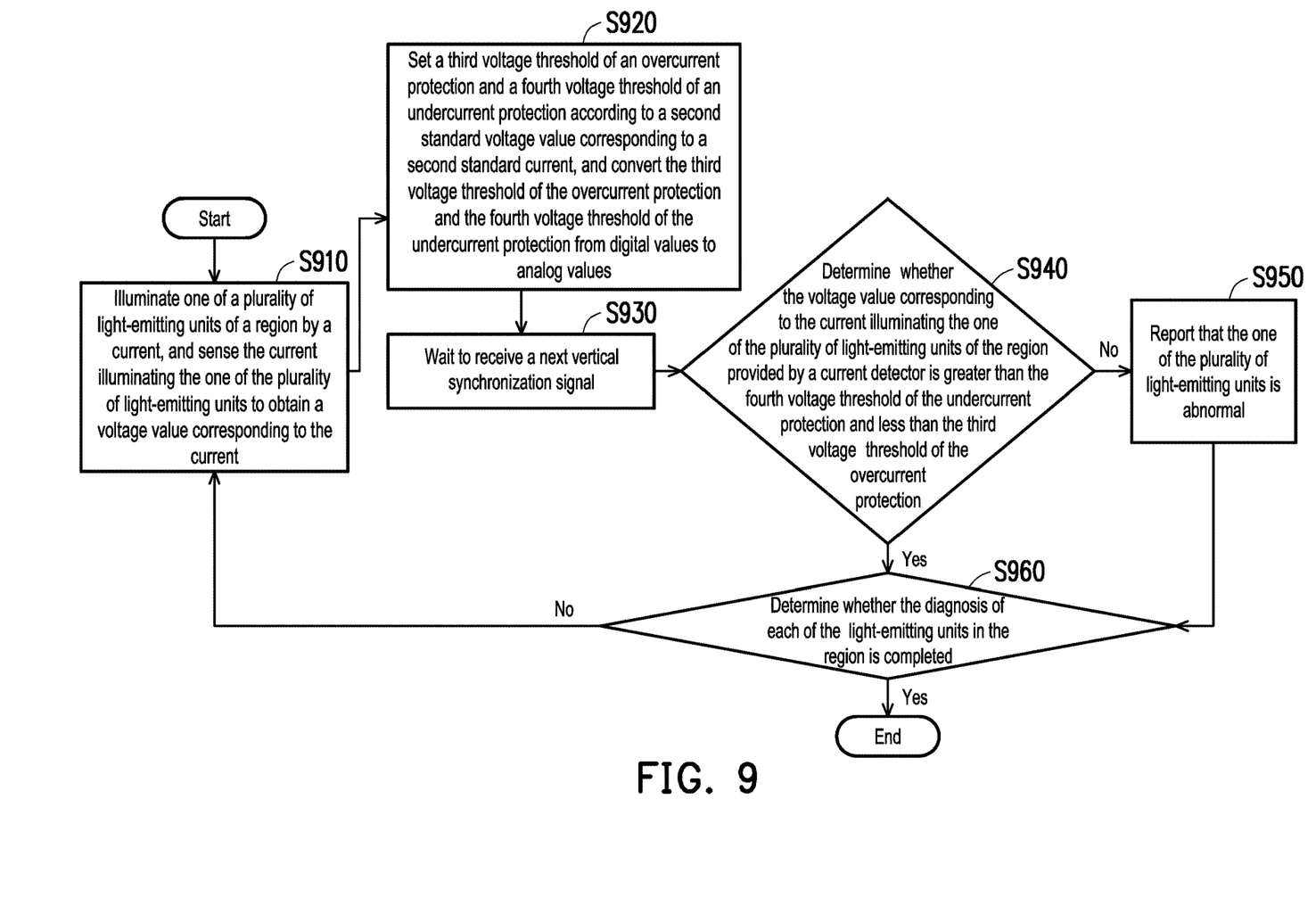
FIG. 9 is a flowchart of a single light-emitting unit diagnostic program of the embodiment of FIG. 7 of the disclosure.

FIG. 9 is a flowchart of a single light-emitting unit diagnostic program of the embodiment of FIG. 7 of the disclosure. Referring to FIG. 2, FIG. 7, and FIG. 9, in the present embodiment, the electronic device 700 may execute steps S910 to S960 to perform a region diagnostic program, and steps S910 to S960 of the present embodiment may be the embodiment of step S860 of FIG. 8. It is exemplified below that the microcontroller 740 determines that the region 710_3 is abnormal. In step S910, the microcontroller 740 may illuminate one of the plurality of light-emitting units in the region 710_3 by a current during the current blanking period (for example, the blanking period BT1 of FIG. 4), and the current detector 760 may sense the current illuminating the one of the plurality of light-emitting units to provide a voltage value (analog value) corresponding to the current to the comparator 761. In step S920, the microcontroller 740 may set the corresponding third voltage threshold TH2_OCP of the overcurrent protection shown in the above formula (3) and fourth voltage threshold TH2_UCP of the undercurrent protection shown in the above formula (4) according to a second standard voltage value (digital value) corresponding to a second standard current in the displaying period (for example, the displaying period DT of FIG. 4), and provide the third voltage threshold TH2_OCP of the overcurrent protection and the fourth voltage threshold TH2_UCP of the undercurrent protection to the DAC 762 to convert the third voltage threshold TH2_OCP of the overcurrent protection and the fourth voltage threshold TH2_UCP of the undercurrent protection from digital values to analog values.

In step S940, the microcontroller 740 waits to receive the next vertical synchronization signal. When the microcontroller 740 receives the next vertical synchronization signal, the microcontroller 740 executes step S940. In step S940, the comparator 761 may implement the determination of the above formula (6) in the next blanking period (for example, the blanking period BT2 of FIG. 4), wherein the comparator 761 determines whether the voltage value (V_IS) corresponding to the current of the one of the plurality of light-emitting units illuminating the region 710_3 provided by the current detector 760 is greater than a third voltage threshold TH2_UCP of the undercurrent protection provided by the DAC 762 and less than a fourth voltage threshold TH2_OCP of the overcurrent protection. If not, the microcontroller 740 executes step S960. If yes, the microcontroller 740 first executes step S950, and then executes step S960. In step S950, the microcontroller 740 reports that the one of the plurality of light-emitting units of the region 710_3 is abnormal. In step S960, the microcontroller 740 determines whether the diagnosis of each light-emitting unit of the region 710_3 is completed. If not, the microcontroller 740 re-executes step S710 to illuminate another one of the plurality of light-emitting units of the region 710_3 via another current. If yes, the microcontroller 740 ends the single light-emitting unit diagnostic program. Therefore, the single light-emitting unit diagnostic program of the present embodiment may efficiently and quickly diagnose the abnormal light-emitting unit in the plurality of light-emitting units 711_1 to 710_N of the light-emitting device 710.

Based on the above, the electronic device and the diagnosis method of the light-emitting device of the disclosure may divide the plurality of light-emitting units of the light-emitting device into a plurality of regions, and diagnose whether the plurality of regions are abnormal in sequence. When one of the plurality of regions is diagnosed as abnormal, the diagnosis method of the light-emitting device of the disclosure may then diagnose whether all the light-emitting units of the abnormal region are abnormal in sequence. Therefore, the diagnosis method of the light-emitting device of the disclosure may provide an efficient diagnostic effect.

Lastly, it should be noted that the above embodiments are used to describe the technical solution of the disclosure instead of limiting it, wherein the features among the various embodiments may be mixed and matched arbitrarily as long as they do not violate the spirit of the disclosure and are not conflicting. Although the disclosure has been described in detail with reference to each embodiment above, those having ordinary skill in the art should understand that the technical solution recited in each embodiment above may still be modified, or some or all of the technical features thereof may be equivalently replaced. These modifications or replacements do not make the essence of the corresponding technical solutions depart from the scope of the technical solution of each embodiment of the disclosure.

What is claimed is:

1. A diagnosis method of a light-emitting device, wherein the light-emitting device comprises at least one region, each region of the at least one region has a plurality of light-emitting units, and the diagnosis method comprises:
   illuminating the plurality of light-emitting units of one of the at least one region by a current;
   comparing a voltage value corresponding to the current with a first standard voltage value corresponding to a first standard current corresponding to the one of the at least one region;
   determining whether the one of the at least one region is abnormal according to a result of comparing the voltage value with the first standard voltage value; and illuminating the plurality of light-emitting units of the one of the at least one region in sequence if it is determined that one of the at least one region is abnormal, comprising:

determining whether the plurality of light-emitting units illuminated in sequence are abnormal individually via a second standard voltage value corresponding to a second standard current.

2. The diagnosis method of claim 1, wherein the at least one region comprises a plurality of regions.

3. The diagnosis method of claim 2, further comprising:
illuminating the plurality of light-emitting units of another region in the plurality of regions by another current;
comparing another voltage value corresponding to the another current with another first standard voltage value corresponding to another first standard current corresponding to the another region in the plurality of regions; and
determining whether the another region of the plurality of regions is abnormal according to a result of comparing the another voltage value with the another first standard voltage value.

4. The diagnosis method of claim 3, further comprising:
illuminating the plurality of light-emitting units of the another region of the plurality of regions in sequence if it is determined that the another region of the plurality of regions is abnormal.

5. The diagnosis method of claim 4, wherein the step of illuminating the plurality of light-emitting units of the another region of the plurality of regions in sequence comprises:
determining whether the plurality of light-emitting units illuminated in sequence are abnormal individually via the second standard voltage value corresponding to the second standard current.

6. The diagnosis method of claim 1, wherein if a difference of the voltage value and the first standard voltage value is greater than a default value, then the one of the at least one region is determined as abnormal.

7. The diagnosis method of claim 1, wherein the light-emitting device is a backlight module of a display.

8. The diagnosis method of claim 1, wherein the step of illuminating the plurality of light-emitting units of one of the at least one region by the current and the step of determining whether the one of the at least one region is abnormal according to a result of comparing the voltage value with the first standard voltage value are respectively performed in different blanking periods.

9. An electronic device, comprising:
a light-emitting device, comprising at least one region, wherein each region of the at least one region has a plurality of light-emitting units;
a power supply module, coupled to the light-emitting device, and configured to illuminate the plurality of light-emitting units of one of the at least one region by a current; and
a microcontroller, coupled to the light-emitting device, and configured to compare a voltage value corresponding to the current with a first standard voltage value corresponding to a first standard current corresponding to the one of the at least one region,
wherein the microcontroller determines whether the one of the at least one region is abnormal according to a result of comparing the voltage value with the first standard voltage value,
wherein the power supply module illuminates the plurality of light-emitting units of the one of the at least one region in sequence when the microcontroller determines that one of the at least one region is abnormal,
wherein the microcontroller determines whether the plurality of light-emitting units illuminated in sequence are abnormal individually via a second standard voltage value corresponding to a second standard current.

10. The electronic device of claim 9, wherein the at least one region comprises a plurality of regions.

11. The electronic device of claim 10, wherein the power supply module illuminates the plurality of light-emitting units of another region in the plurality of regions by another current, and the microcontroller compares another voltage value corresponding to the another current with another first standard voltage value corresponding to another first standard current corresponding to the another region in the plurality of regions,
wherein the microcontroller determines whether the another region of the plurality of regions is abnormal according to a result of comparing the another voltage value with the another first standard voltage value.

12. The electronic device of claim 11, wherein the power supply module illuminates the plurality of light-emitting units of the another region of the plurality of regions in sequence if it is determined that the another region of the plurality of regions is abnormal.

13. The electronic device of claim 12, wherein the microcontroller determines whether the plurality of light-emitting units illuminated in sequence are abnormal individually via the second standard voltage value corresponding to the second standard current.

14. The electronic device of claim 9, wherein if a difference of the voltage value and the first standard voltage value is greater than a default value, then the microcontroller determines the one of the at least one region as abnormal.

15. The electronic device of claim 9, wherein the light-emitting device is a backlight module of a display.

16. The electronic device of claim 9, wherein the power supply module performs an operation for illuminating the plurality of light-emitting units of one of the at least one region by the current and the microcontroller performs another operation for determining whether the one of the at least one region is abnormal according to a result of comparing the voltage value with the first standard voltage value, wherein the operation and the another operation are respectively performed in different blanking periods.

* * * * *